(12) United States Patent
Robert et al.

(10) Patent No.: US 6,734,514 B2
(45) Date of Patent: May 11, 2004

(54) HALL EFFECT SENSOR

(75) Inventors: Jean-Louis Robert, Le Cres (FR); Julien Pernot, Montpellier (FR); Jean Camassel, Saint-Clement-De-Riviere (FR); Sylvie Contreras, Chemin Vieux (FR)

(73) Assignee: Centre National de la Recherche-Scientifique - CNRS (FR)

( * ) Notice: Subject to any disclaimer, the term of this patent is extended or adjusted under 35 U.S.C. 154(b) by 0 days.

(21) Appl. No.: 10/374,656

(22) Filed: Feb. 26, 2003

(65) Prior Publication Data

US 2003/0164530 A1 Sep. 4, 2003

Related U.S. Application Data

(63) Continuation of application No. PCT/FR01/02703, filed on Aug. 30, 2001.

(51) Int. Cl.$^7$ ................................................. H01L 29/82
(52) U.S. Cl. ........................ 257/425; 257/77; 257/421; 257/426
(58) Field of Search .......................... 257/425, 77, 427, 257/421, 422, 426

(56) References Cited

U.S. PATENT DOCUMENTS

| | | | |
|---|---|---|---|
| 4,315,273 A | * | 2/1982 | Yamamoto et al. ........... 357/27 |
| 5,354,412 A | | 10/1994 | Suzuki et al. |
| 5,536,953 A | | 7/1996 | Dreifus et al. |

FOREIGN PATENT DOCUMENTS

EP 0 458 466 A2 11/1991

* cited by examiner

*Primary Examiner*—Sara Crane
(74) *Attorney, Agent, or Firm*—Piper Rudnick LLP

(57) ABSTRACT

A metrological Hall effect sensor with sensitivity to temperature less than 250 ppm/° C. and with high Hall effect coefficient for temperatures greater than 200° C. formed in a multilayer structure comprising a thin active layer deposited on a substrate, wherein the substrate is made of monocrystalline silicon carbide (SiC), and wherein the thin active layer is made of a weakly type n-doped silicon carbide (SiC) semiconductor in the exhaustion regime.

12 Claims, 1 Drawing Sheet

View along the plane of section AA' of said sensor

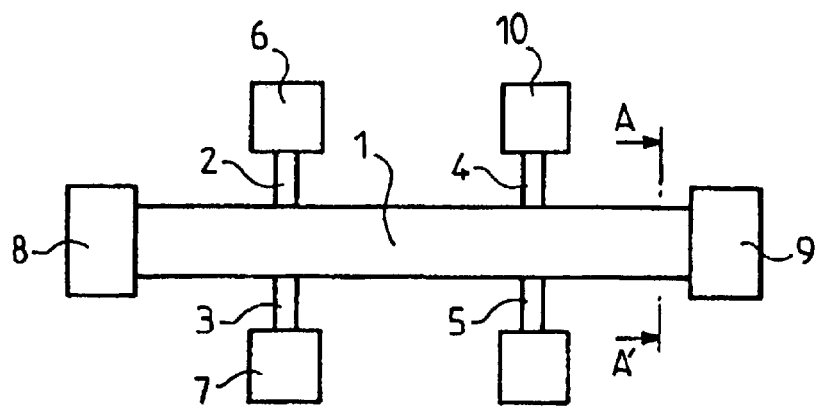
FIG.1 Sensor seen from above
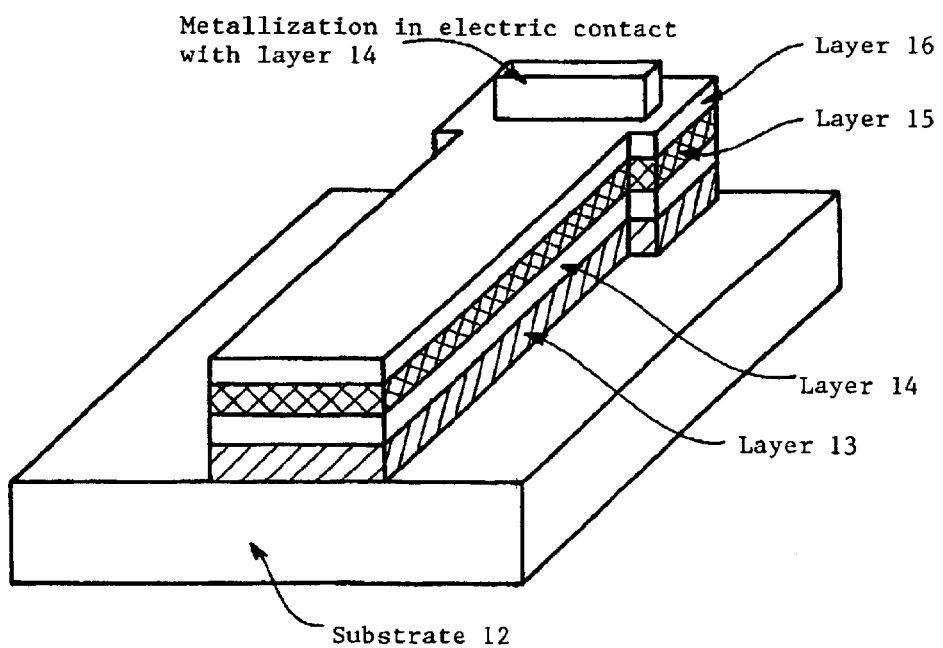
FIG.2 View along the plane of section AA' of said sensor

HALL EFFECT SENSOR

RELATED APPLICATION

This is a continuation of International Application No. PCT/FR01/02703, with an international filing date of Aug. 30, 2001, which claims priority of French Application No. 00/11087, filed Aug. 30, 2000.

FIELD OF THE INVENTION

This invention pertains to the field of Hall sensors intended for the quantitative measurement of magnetic fields.

BACKGROUND

The general principle of Hall effect sensors is well known. In particular, sensors are known which are constituted by a multilayer structure comprising a thin layer of a semiconductor material deposited on a substrate which is itself a semiconductor, with the two layers being electrically isolated from each other.

As an example, European patent EP 572,298 describes a "two-dimensional electron gas" Hall effect sensor comprising, on an isolating substrate, a quantum well structure, a carrier supply layer adjacent to the quantum well structure, of a thickness less than 250 angstroms and possessing a surface density of donors integrated over the entire surface of the supply layer of carriers lower than a threshold value, an isolating burial layer deposited on the carrier supply layer, possessing an energy conduction band greater than the fermi energy of the sensor and of a thickness greater than 200 angstroms.

European patent EP 458,466 describes a Hall effect device comprising a substrate, an active layer formed by a diamond semiconductor deposited on the substrate, a pair of electrodes deposited on the opposite sides of the active layer, for introducing a current in the active layer in one direction and another pair of electrodes deposited on the other opposite sides of the active layer for detecting a tension or a tension component which is induced in a direction which is generally orthogonal to the direction of the current.

U.S. Pat. No. 5,536,953 describes a broad-band semiconductor comprising multiple dopants at low concentrations.

The problem that characterizes the sensors according to the prior art is that of the operating domain. In fact, the metrological performances of the sensors according to the prior art degrade (decrease in sensitivity, nonlinearity, etc.) at temperatures higher than 200° C. This degradation is linked to the performance of the structure (deficiencies in the electric isolation of the active/substrate layer) and/or the active layer (change in the conduction mechanisms, etc.).

It would therefore be advantageous to provide a Hall effect sensor exhibiting low sensitivity to temperature, typically of less than 250 ppm/° C. for operating temperatures greater than 200° C., and having a high Hall KH coefficient on the order of several hundreds of volt/ampere/tesla. KH is inversely proportional to the surface carrier density and the electron charge.

SUMMARY OF THE INVENTION

This invention relates to a Hall effect sensor formed in a multilayer structure including a thin active layer deposited on a substrate, wherein the substrate is an insulating, semi-insulating or semiconductor material of type $p^-$ or $n^+$, respectively, to electrically isolate the active layer of the substrate and wherein the active layer is a weakly doped semiconductor material of type $n^-$ or $p^-$ in an exhaustion regime.

This invention also relates to the above Hall effect sensor, further including a bar having a body extended by two pairs of lateral arms, with the body having at each of end portions thereof an electrode for electric power, two opposed lateral arms including electrodes for acquisition of a Hall signal and two adjacent arms having electrodes for measuring resistance.

BRIEF DESCRIPTION OF THE INVENTION

Better comprehension of the invention will be obtained from the description below of a nonlimitative example of implementation which refers to the attached drawings in which:

FIG. 1 represents a top view of a sensor according to aspects of the invention; and FIG. 2 represents a view along a cross-sectional plane of the sensor of FIG. 1.

DETAILED DESCRIPTION

It will be appreciated that the following description is intended to refer to specific embodiments of the invention selected for illustration in the drawings and is not intended to define or limit the invention, other than in the appended claims.

The invention in its most general sense pertains to a Hall effect sensor constituted by a multilayer structure comprising a thin active layer made of a semiconductor material deposited on an isolating, semi-isolating or semiconductor substrate but of a type different from that of the thin semiconductor layer. The active layer is electrically isolated from the substrate.

The active layer is preferably covered by an insulator (for example, silicon oxide or nitride) or by a passivation insulator. The doping level of the active layer is selected such that the sensor operates in an exhaustion regime (total ionization of the dopants) over the entire temperature range corresponding to use.

According to a first embodiment, the active layer and/or the insulating layer and/or the substrate are constituted by a hexagonal silicon carbide layer. The doping level of the $n^-$ active layer is advantageously lower than about $5 \cdot 10^{15}$ per $cm^3$. According to another embodiment, the active layer is a cubic silicon carbide layer and the active layer is a layer of nitrides based on GaN and/or its alloys. The active layer may be made from a material with a weaker forbidden band than that of the above materials (the case, e.g., of silicon).

The temperature range corresponding to the exhaustion regime is, in this case, shifted toward low temperatures (below about 200° C.) and is limited toward high temperatures (>about 200° C.). The sensitivity to temperature can be higher than in the preceding cases and not constant over the entire temperature interval corresponding to the exhaustion regime and to use. The materials forming the substrate and the active layer are preferably of the same substance with different dopings.

According to another embodiment, the active layer can be transferred onto a substrate of a different substance. It can be adhered by molecular adhesion.

According to a preferred embodiment, the invention pertains to a Hall effect sensor constituted by a multilayer structure comprising a thin active layer of a semiconductor material deposited on a semiconductor substrate, the two layers being isolated electrically by an insulating layer. The overall structure is characterized in that the substrate is a type n+ semiconductor material on which is deposited an insulating material constituted by a type p− semiconductor material and in that the thin active layer is of type n−.

According to a particularly preferred embodiment, the sensor according to the invention is constituted by a bar having a body extended by two pairs of lateral arms, with the body having at each of its end portions an electrode for electric power, two opposed lateral arms comprising electrodes for acquisition of the Hall signal and two adjacent arms having electrodes for measuring the resistance.

Turning now to the drawings, the Hall sensor according to the example of implementation described as an example has a general shape of a "cross of Lorraine" with a body (1), a first pair of lateral arms (2, 3) and a second pair of lateral arms (4, 5), with the unit being designed to measure a magnetic field perpendicular to the plane formed by the median axis of the body (1) and by the median axis of at least-one pair of arms (e.g., 2, 3).

One of the pairs of arms (2, 3) has electrodes (6, 7) for acquisition of the Hall signal. The body also has two electrodes (8, 9) positioned at opposite ends for powering with an excitation tension or a current feed. Moreover, two adjacent arms (2, 4) have electrodes (6, 10) for measuring the resistance of the structure, a measurement which allows deduction of the temperature of the Hall sensor.

FIG. 2 is a view along a cross-sectional plane. The Hall sensor according to a first embodiment is designed to have an impedance of several kilo-ohms, typically on the order of about 10 kilo-ohms, a thermal sensitivity on the order of about 200 ppm/° C. and a KH factor on the order of multiple hundreds of volt/ampere/tesla.

The Hall sensor is constituted by a substrate (12) made of an n+ doped semiconductor to attain these performance levels. The semiconductor is monocrystalline of the silicon carbide (SiC) type, preferably of the 4H-SiC type. An insulating layer (13) is deposited on this substrate, e.g., by epitaxial growth. This layer is constituted by a semiconductor material substantially identical to that of the p+ doped substrate.

On this insulating layer (13) is deposited a thin active layer (14) constituted by an n− doped semiconductor. The semiconductor is monocrystalline of the silicon carbide SiC type, of type 4H-SiC. The active layer is itself optionally covered by an insulating layer (15) and a passivation layer (16), e.g., of silicon oxide ($SiO_2$).

The sensor according to aspects of the invention employs large-gap semiconductors working in exhaustion regime.

According to one embodiment, the active layer can be deposited in the form of nitrides (GaN and/or alloys). The substrate can be sapphire on which is deposited a buffer layer, or silicon carbide with a buffer layer, or a nitride or any other substrate.

What is claimed is:

1. A meterological Hall effect sensor with sensitivity of temperature of less than 250 ppm/° C. and with high Hall effect coefficient for temperatures greater than 200° C. formed in a multilayer structure comprising: a thin active layer deposited on a substrate, wherein said substrate is made of a monocrystalline silicon carbide (SiC), wherein said thin active layer is made of a weakly type n− doped silicon carbide (SiC) semiconductor in the exhaustion regime.

2. The metrological Hall effect sensor according to claim 1, wherein said substrate is p− doped in order to electrically isolate said thin active layer from said substrate.

3. The metrological Hall effect sensor according to claim 1, wherein said substrate is n+ type, and an intermediate thin p− type layer is deposited between said substrate and said thin active layer in order to electrically isolate said thin active layer from said substrate.

4. The metrological Hall effect sensor according to claim 1, wherein said thin active layer is covered by a thermal oxide and by a passivation insulator.

5. The metrological Hall effect sensor according to claim 1, wherein the doping level of said thin active layer is lower than $5 \cdot 10^{15}$ per $cm^3$.

6. The metrological Hall effect sensor according to claim 1, wherein said active layer is made of hexagonal silicon carbide.

7. The metrological Hall effect sensor according to claim 1, wherein said substrate is made of hexagonal silicon carbide.

8. The metrological Hall effect sensor according to claim 1, wherein said thin active layer is made of cubic silicon carbide.

9. The metrological Hall effect sensor according to claim 2, wherein said substrate and said substrate and thin active layer are made of the same substance.

10. The metrological Hall effect sensor according to claim 3, wherein said substrate, said deposited insulating layer, and said thin active layer are made of the same substance.

11. The metrological Hall effect sensor according to claim 1, wherein said thin active layer is formed onto a substrate of a different substance.

12. The metrological Hall effect sensor according to claim 1, further comprising a bar having a body extended by two pairs of lateral arms, with the body having at each end portion thereof an electrode for electric power, two opposed lateral arms comprising electrodes for acquisition of a Hall signal and two adjacent arms having electrodes for measuring resistance.

* * * * *